United States Patent [19]

Golwalkar et al.

[11] Patent Number: 5,366,933
[45] Date of Patent: Nov. 22, 1994

[54] METHOD FOR CONSTRUCTING A DUAL SIDED, WIRE BONDED INTEGRATED CIRCUIT CHIP PACKAGE

[75] Inventors: Suresh V. Golwalkar, Folsom; Richard Foehringer, Fair Oaks; Michael Wentling, Cameron Park, all of Calif.; Ryo Takatsuki, Ibaraki; Shigeo Kawashima, Kitakyusyu, both of Japan

[73] Assignee: Intel Corporation, Santa Clara, Calif.

[21] Appl. No.: 135,732

[22] Filed: Oct. 13, 1993

[51] Int. Cl.⁵ ............................................ H01L 21/60
[52] U.S. Cl. ................................. 437/215; 437/207; 437/208; 437/209; 437/214; 437/217; 437/220
[58] Field of Search ............... 437/206, 207, 208, 209, 437/211, 214, 215, 216, 217, 218, 219, 220

[56] References Cited

U.S. PATENT DOCUMENTS

| 5,034,350 | 7/1991 | Marchisi ........................ 437/216 |
| 5,082,802 | 1/1992 | Gelsomini ....................... 437/211 |
| 5,202,288 | 4/1993 | Doering et al. ................. 437/217 |
| 5,227,338 | 7/1993 | Kryzaninsky .................. 437/209 |
| 5,273,938 | 12/1993 | Lin et al. ........................ 437/207 |

FOREIGN PATENT DOCUMENTS 3-277927 10/1991 Japan.

Primary Examiner—Brian Hearn
Assistant Examiner—Kevin M. Picardat
Attorney, Agent, or Firm—Blakely, Sokoloff, Taylor & Zafman

[57] ABSTRACT

A method for constructing a dual sided integrated circuit chip package. A leadframe is formed comprising a set of die pads, and a set of lead fingers corresponding to each die pad. An integrated circuit die is disposed onto a first side and a second side of each die pad. Each integrated circuit die is wire bonded to the corresponding lead fingers. The temperature during the second side die attach and wire bonding steps is controlled and/or compatible materials are selected to prevent warping of the leadframe, and special steps are also implemented to eliminate mold flash, plastic mold cracking and overcuring and increasing the adhesion.

19 Claims, 17 Drawing Sheets

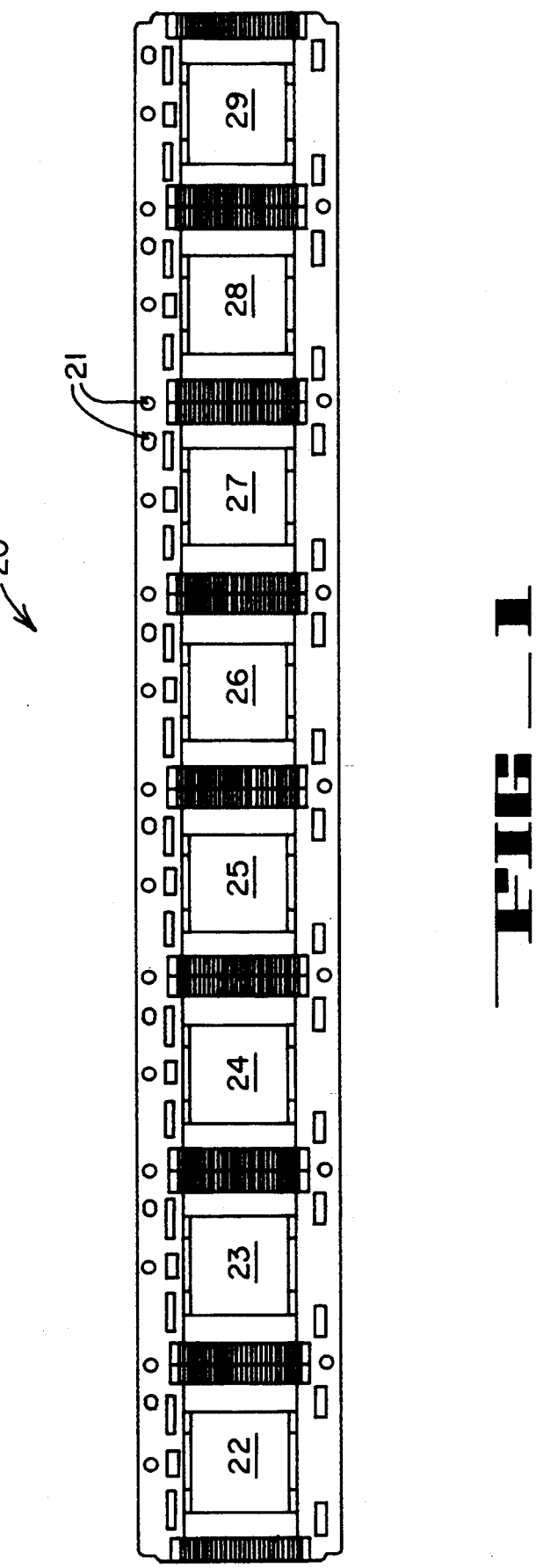
FIG_1

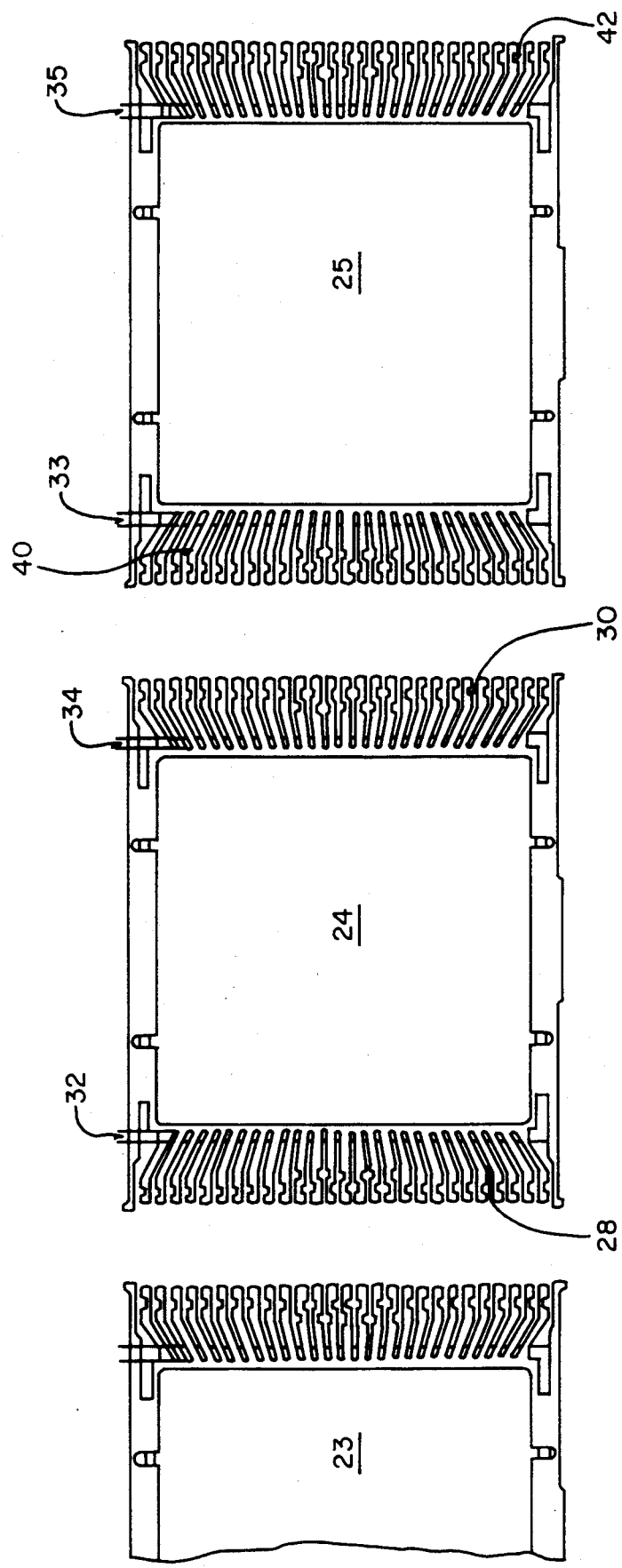
FIG—2A

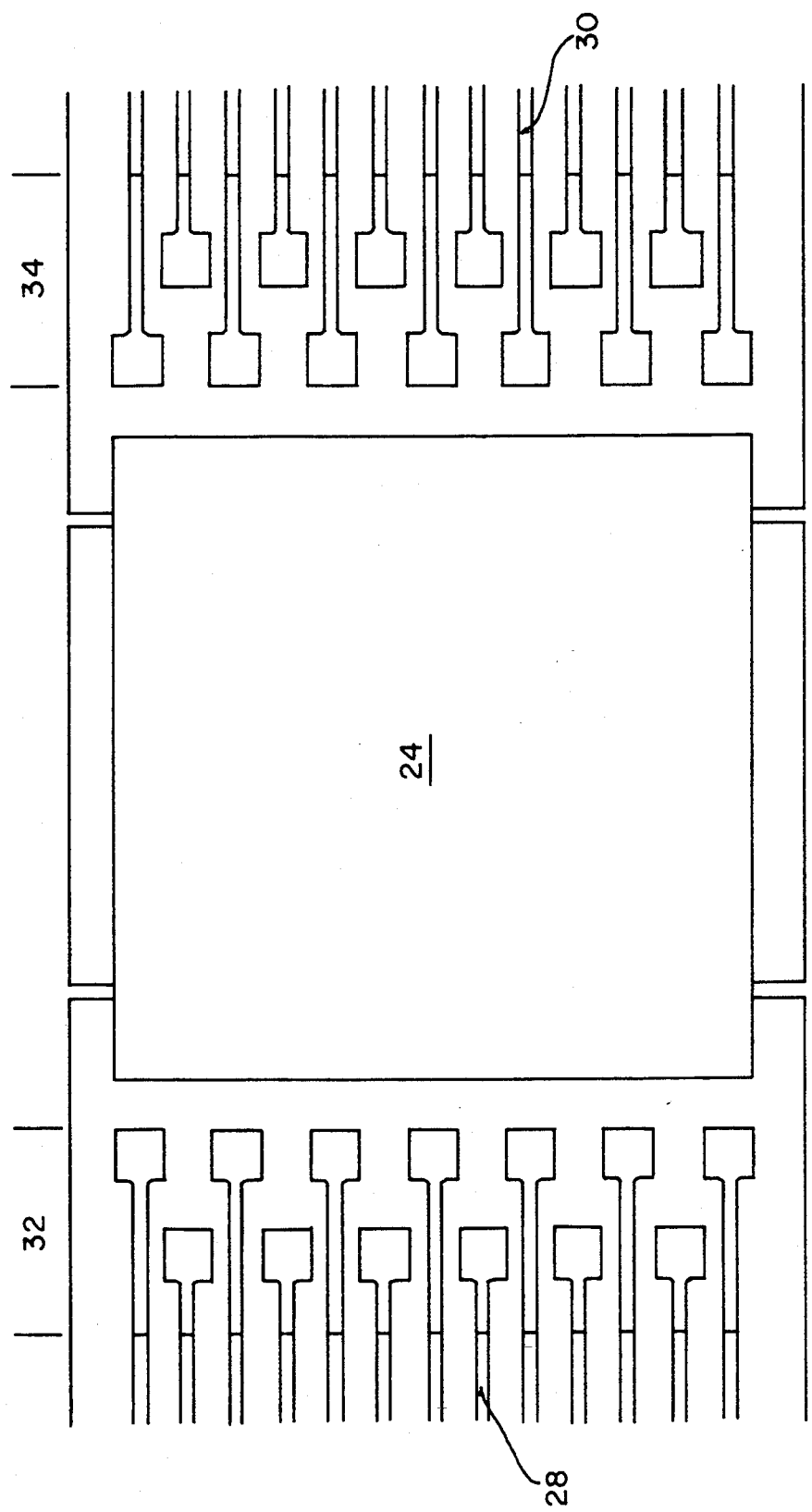
FIG_2B

FIG_9

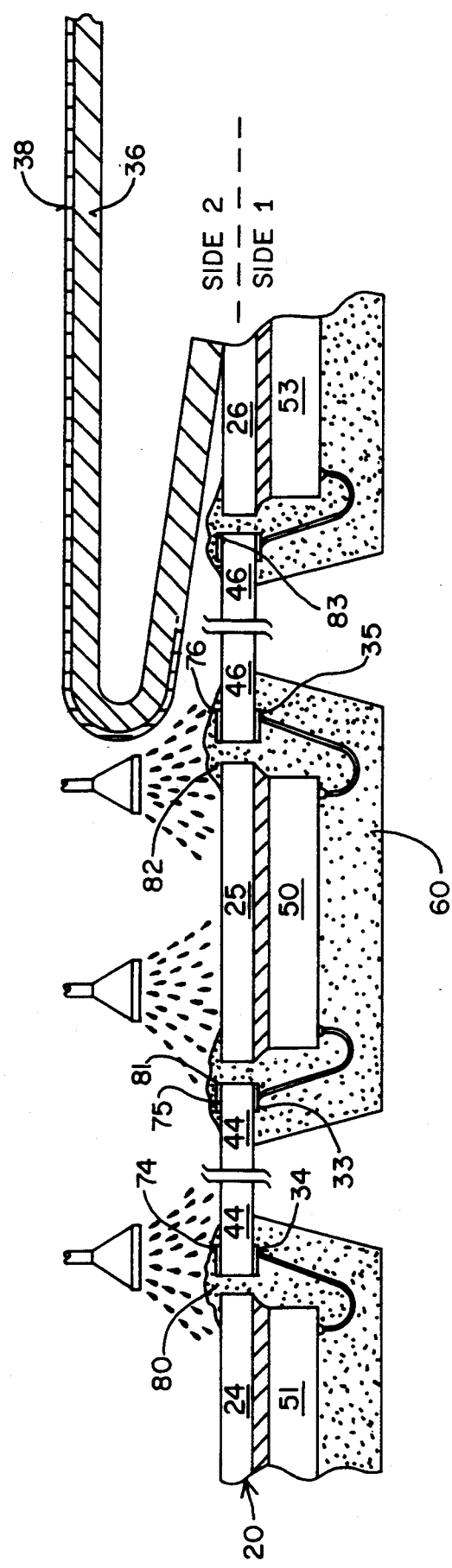
FIG—11

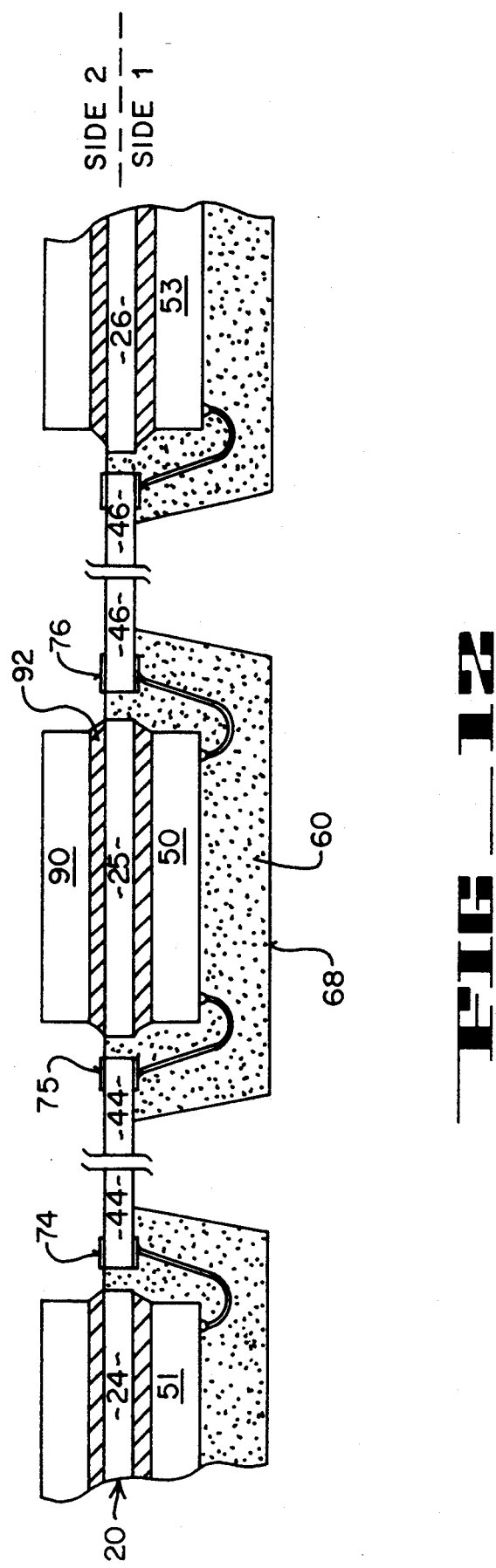
FIG_12

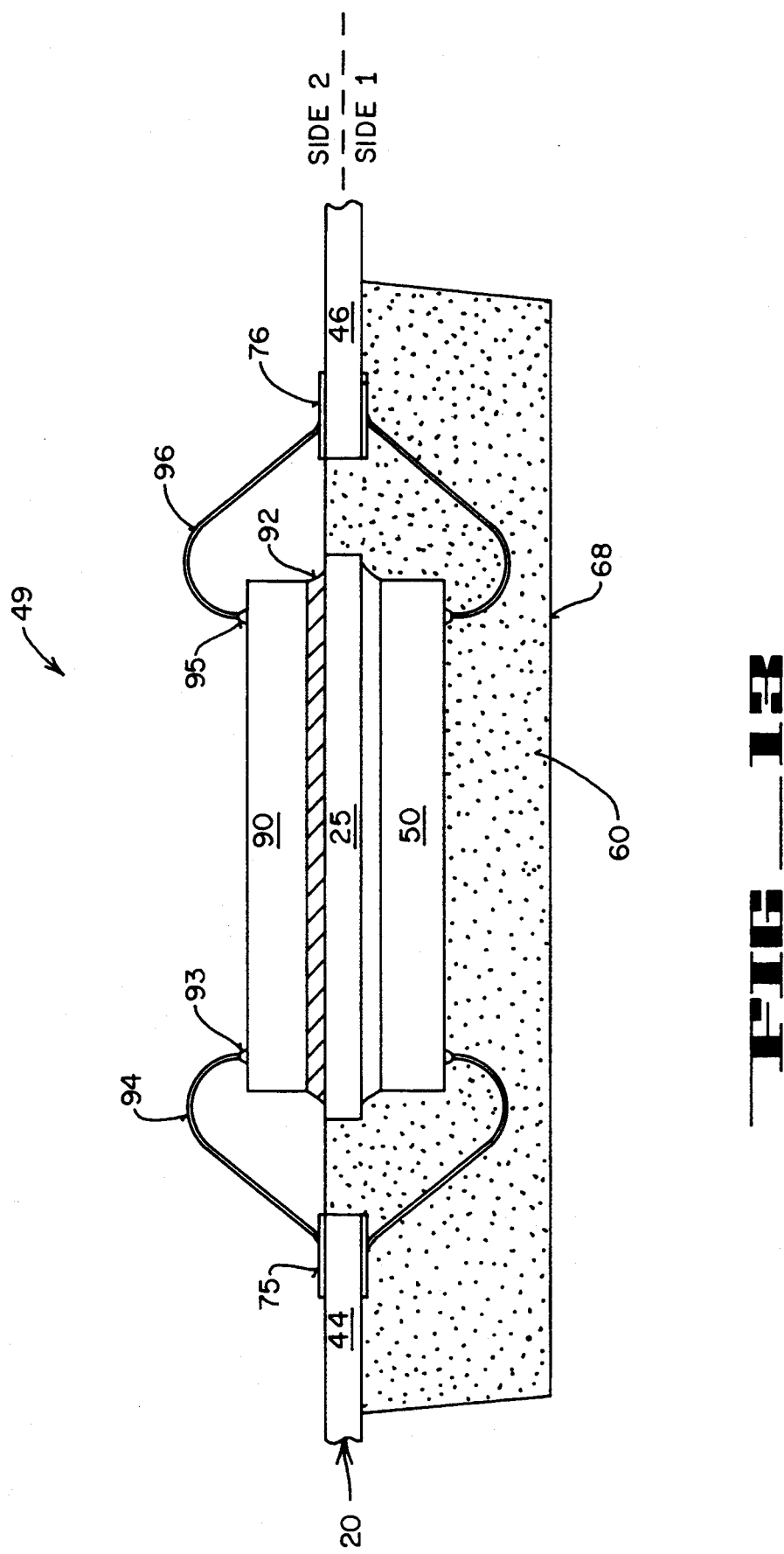
FIG—13

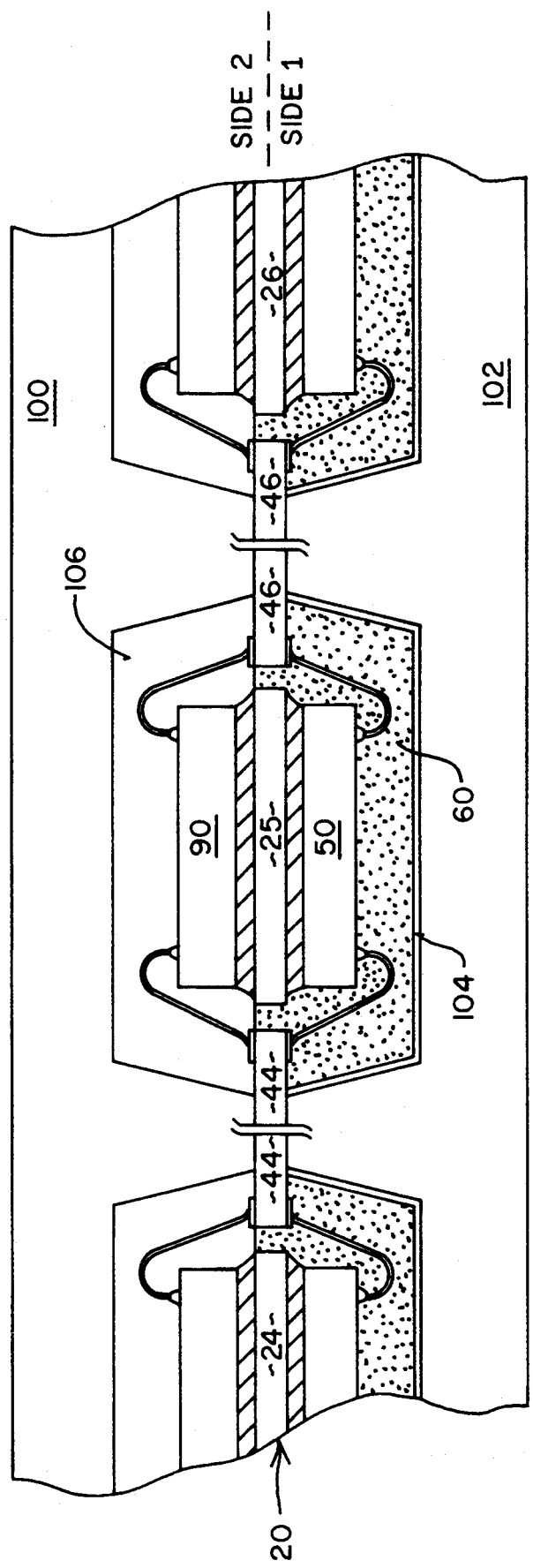
FIG_14A

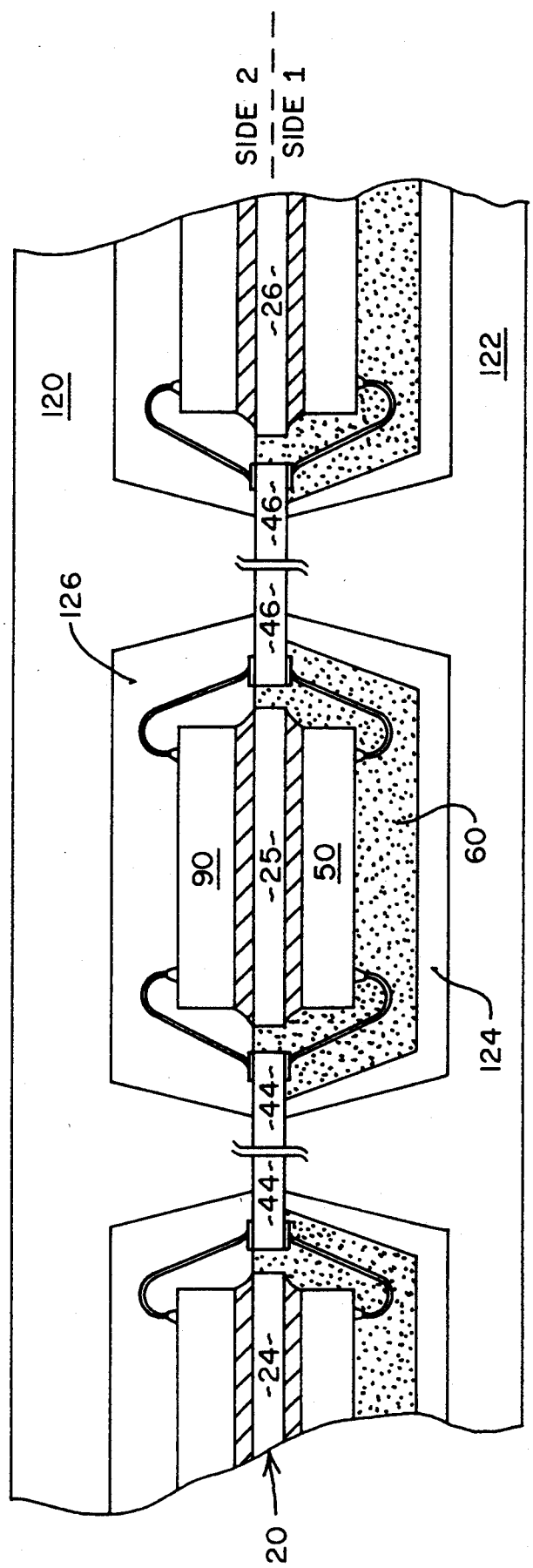
FIG_14B

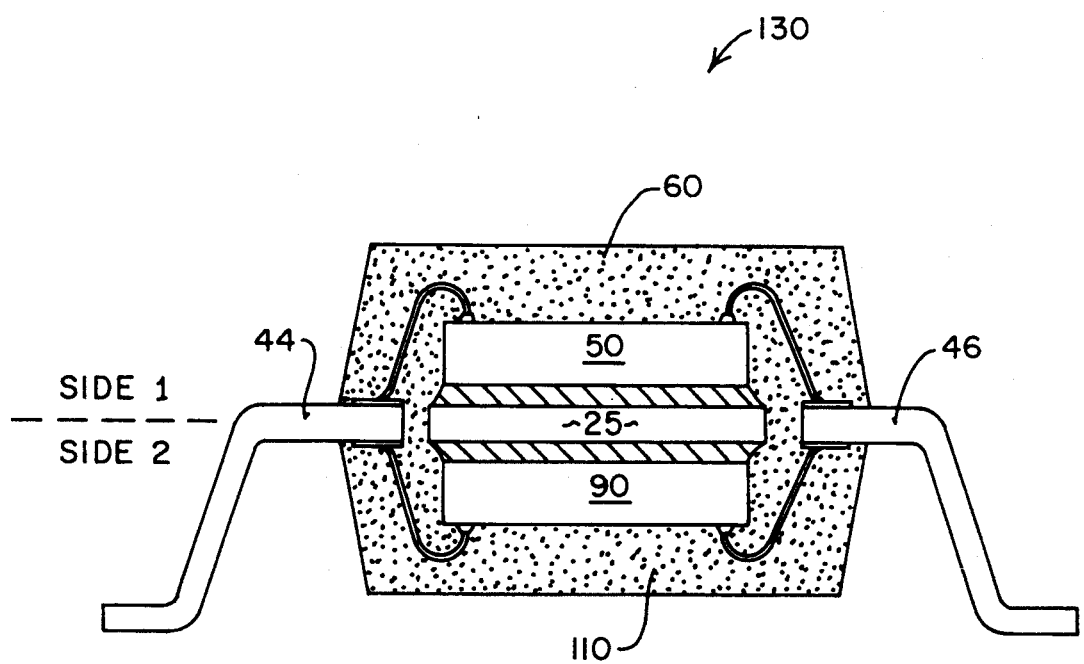
FIG_15

METHOD FOR CONSTRUCTING A DUAL SIDED, WIRE BONDED INTEGRATED CIRCUIT CHIP PACKAGE

BACKGROUND OF THE INVENTION

1. Field of the Invention

The present invention pertains to the field of integrated circuit die packaging. More particularly, this invention relates to a method for constructing a dual sided integrated circuit chip package that employs wire bond process technology.

2. Art Background

Plastic chip packages are commonly employed for holding integrated circuit dies. A typical prior plastic package is constructed on a section of a metal leadframe. Each leadframe section provides a die pad for mounting an integrated circuit die. Each leadframe section also provides a set of lead fingers for electrical connection between the corresponding integrated circuit die and external circuitry. Such a plastic package provides protection for the integrated circuit die and provides electrical connection to the integrated circuit die via the lead fingers extending from the package.

Such prior plastic chip packages typically contain one integrated circuit die per package. The integrated circuit die is typically mounted on one side of a die pad. The integrated circuit is usually mounted on either the top or the bottom side of the die pad. Typically, the integrated circuit die, attached to a die pad, is wire bonded to corresponding lead fingers. The die pad, the integrated circuit die, and the wire bonding are typically encapsulated with molding compound through plastic injection molding or with glob top.

The utility of an integrated circuit chip package can be increased by enclosing two or more integrated circuit dies in one chip package. For example, an integrated circuit die package containing two memory chips can double the density of a memory system without increasing the printed circuit board area containing the memory chips.

Prior manufacturing techniques for constructing double sided integrated circuit chip packages usually employ tape automated bonding (TAB) techniques. Unfortunately, TAB techniques commonly require the formation of gold signal pad structures on the integrated circuit dies. The formation of gold structures increases the cost of such double sided chip packages. In addition, TAB techniques typically require gang bonding equipment for the manufacturing process. Such gang bonding equipment greatly increases the manufacturing cost for such double sided packages. Moreover, TAB techniques may not be as reliable as conventional wire bonding techniques.

SUMMARY AND OBJECTS OF THE INVENTION

One object of the present invention is to provide a method for constructing a dual sided integrated circuit chip package while employing wire bonding techniques.

Another object of the present invention is to attain construction of a dual sided integrated circuit chip package while preventing damage to the integrated circuit dies caused by leadframe or package deformation such as warping.

Another object of the present invention is to prevent damage to a dual sided integrated circuit chip package during manufacturing by preventing overcuring of the plastic packages.

A further object of the present invention is to prevent damage to a dual sided integrated circuit chip package during manufacturing by preventing overheating of the plastic packages during wire bonding.

These and other objects of the invention are provided by a method for constructing a dual sided integrated circuit chip package. A leadframe is formed comprising of a set of die pads, and a set of lead fingers corresponding to each die pad. The leadframe has a first side and a second side. A metal plating is disposed on the first side and the second side of a tip of each lead finger, and a tape is placed on the second side of the leadframe with a tape adhesive layer. A side one integrated circuit die is then disposed onto the first side of each die pad, such that the side one integrated circuit dies are attached to the die pads with a first adhesive layer. Each side one integrated circuit die is then wire bonded to the first side of the corresponding lead fingers. A side one plastic mold is formed over each side one integrated circuit die using an injection mold press.

The tape is then removed from the second side of the leadframe by applying heat to the leadframe if necessary. The residue of tape adhesive layer is cleaned from the second side of the leadframe with a combination of chemical and/or an electrolytic cleaning. The cleaning of the second side removes mold flash of the side one plastic molds, thereby revealing a clean metal plating surface on the second side at the tip of each lead finger for wire bonding.

A side two integrated circuit die is disposed on the second side of each die pad while maintaining a high temperature if necessary, such that the side two integrated circuit dies are attached to the die pads with a second adhesive layer. Each side two integrated circuit die is wire bonded to the second side of the corresponding lead fingers using a combination of mechanical force and an ultrasonic energy to overcome an energy absorption of the side one plastic molds. A side two plastic mold is formed over each side two integrated circuit die using the injection mold press, wherein the injection mold press provides a bottom mold with a cavity corresponding to each side one plastic mold. The cavities in the bottom mold accept the side one plastic molds.

Other objects, features and advantages of the present invention will be apparent from the accompanying drawings, and from the detailed description that follows below.

BRIEF DESCRIPTION OF THE DRAWINGS

The present invention is illustrated by way of example and not limitation in the figures of the accompanying drawings in which like references indicate similar elements, and in which:

FIG. 1 is a top view showing one side of a leadframe for one embodiment;

FIG. 2a is a top view of the leadframe which shows the die pads and corresponding lead fingers;

FIG. 2b is a close up top view of a portion of the leadframe that shows staggered lead finger tips having expanded surface areas;

FIG. 11 illustrates the tape removal and cleaning steps on side 2 of the leadframe;

FIG. 12 provides a cross sectional view of the leadframe and attached integrated circuit dies on side 2;

FIG. 13 illustrates the wire bonding of the integrated circuit die to the lead fingers on side 2;

FIG. 14a is a cross sectional view of the integrated circuit die assemblies on side 2 of the leadframe positioned in an injection mold press;

FIG. 14b is a cross sectional view of the integrated circuit die assemblies on side 2 of the leadframe positioned in an injection mold press for an alternative embodiment;

FIG. 15 is a cross sectional view of a dual-side plastic chip package for one embodiment.

DETAILED DESCRIPTION

Figure 3:
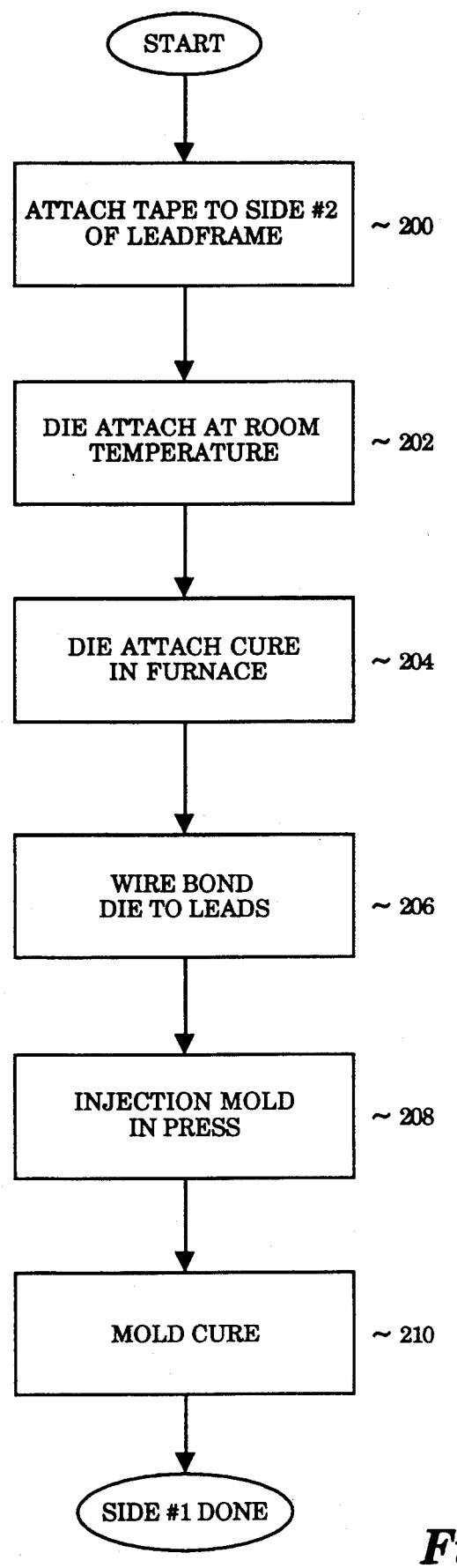
FIG. 3 lists a series of process steps applied to side 1 of the leadframe.

FIG. 1 is a top view showing one side of a leadframe 20. One side of the leadframe 20 is hereinafter referred to as side 1, and the opposite side of the leadframe 20 is referred to as side 2. The leadframe 20 forms a set of die pads 22–29. The die pads 22–29 provide mounting platforms for integrated circuit dies. The leadframe 20 also forms a set of lead fingers corresponding to each of the die pads 22–29.

During a leadframe formation step, the die pads 22–29 and the corresponding lead fingers are etched into the leadframe 20. Alternatively, the die pads 22–29 and corresponding lead fingers may be stamped into the leadframe 20.

The leadframe 20 is preferably constructed from either steel or copper. The steel or copper materials are selected for interactive properties with silicon and plastic. For one embodiment, the leadframe 20 is typically 5 mils thick.

A set of alignment holes are formed in the leadframe 20. The alignment holes, such as alignment holes 22, are employed to precisely position the leadframe 20 during the chip package manufacturing process.

FIG. 2a is a top view of the leadframe 20, and shows the die pads 24 and 25 and corresponding lead fingers. A set of lead fingers 28 and a set of lead fingers 30 correspond to the die pad 24. The lead fingers 28 and 30 enable electrical coupling to the integrated circuit dies mounted to the die pad 24. A set of lead fingers 40 and a set of lead fingers 42 enable electrical coupling to the integrated circuit dies mounted to the die pad 25.

During a leadframe plating step, a silver plating is deposited on both sides of the die pads 22–29. A spot silver plating is also deposited on both sides of the tips of the lead fingers corresponding to the die pads 22–29. For example, a spot silver plating is deposited along area 32 of the lead fingers 28, and along area 34 of the lead fingers 30. Similarly, a spot silver plating is deposited along area 33 of the lead fingers 40, and along area 35 of the lead fingers 42.

The silver plating may be applied to side 1 of the leadframe 20 and then to side 2. Alternatively, the silver plating may be applied to both side 1 and side 2 of the leadframe 20 concurrently.

The silver plating applied to the die pads 22–29 improves the thermal and electrical conduction between the integrated circuit dies and the die pads 22–29. The silver plating to the tips of the lead fingers enables wire bonding of gold signal leads to the leadframe 20. Alternatively, the plating step on the die pads 22–29 may be skipped to enhance adhesion between the leadframe 20 and a molding compound.

The leadframe plating step is simplified by applying a silver plating to the die pads 22–29 as well as the lead fingers. If the die pads 22–29 are not plated along with the lead fingers, a separate masking for the die pads 22–29 is required.

As an alternative to silver plating, a gold plating or a palladium plating may be deposited to the die pads 22–29 and the tips of the corresponding lead fingers.

FIG. 2b is a top view of the leadframe 20 showing the die pad 24 and the corresponding lead fingers 28 and 30. The bondability of side 2 is increased by increasing surface area of the lead fingers 28 and 30 in the areas 32 and 34 and by staggering the lead finger pads as shown. The increased surface area of the lead finger pads in areas 32 and 34 improves tape adhesion to side 1. The increased surface area of the lead finger pads in areas 32 and 34 also controls mold flash because less molding compound penetrates through the leadframe 20. The increased surface area of the lead finger pads in areas 32 and 34 also provides an increased target area for improved bonding during a wire bonding process step.

FIG. 3 lists a series of process steps 200–210 applied to side 1 of the leadframe 20. The process steps 200–210 are applied to form a plastic chip package to side 1 of each of the die pads 22–29.

Figure 4:
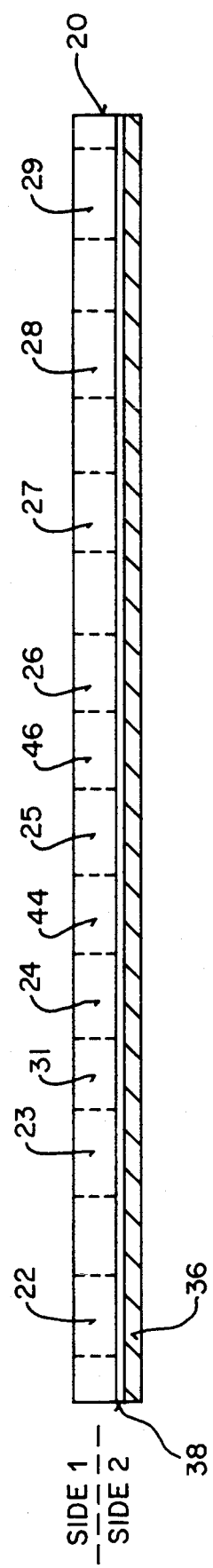
FIG. 4 is a cross sectional view showing a tape applied to side 2 of the leadframe via an adhesive layer.

At process step 200, a tape is attached to side 2 of the leadframe 20. FIG. 4 is a cross sectional view of the leadframe 20 at process step 200. A tape 36 is shown applied to side 2 of the leadframe 20. The tape 36 is held to the leadframe 20 via an adhesive layer 38. The tape 36 is applied to side 2 to contain plastic molding during the process step 208. For one embodiment, the tape 36 is a plastic tape.

The lead fingers 40 include a lead finger 44 which corresponds to the die pad 25. The lead fingers 42 include a lead finger 46 which corresponds to the die pad 25.

Figure 5:
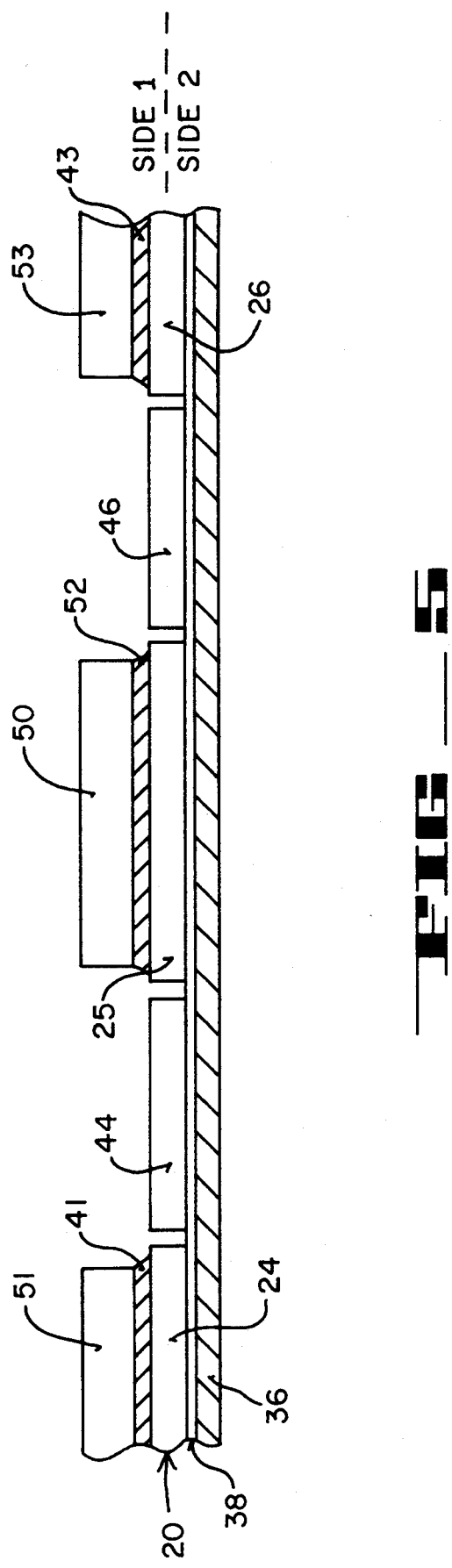
FIG. 5 illustrates a cross sectional view of the leadframe and attached integrated circuit dies attached to side 1.

At process step 202, an integrated circuit die is attached to each die pad 22–29 on side 1 of the leadframe 20. FIG. 5 is a cross sectional view of the leadframe 20 and attached integrated circuit dies at process step 202. An integrated circuit die 50 is shown attached to side 1 of the die pad 25 through an adhesive layer 52. An integrated circuit die 51 is partially shown attached to side 1 of the die pad 24 through an adhesive layer 41, and an integrated circuit die 53 is partially shown attached to side 1 of the die pad 26 through an adhesive layer 43.

The process step 202 is performed at room temperature. For one embodiment, a KNS 6300 die attach machine manufactured by Kulickson-Sofa is employed to attach integrated circuit dies to the die pads 22-29. The KNS 6300 dispenses a die attach paste to form the adhesive layers 41, 52, and 43, places the integrated circuit dies 51, 50, and 53, and aligns the integrated circuit dies 51, 50, and 53 to the leadframe 20. The KNS 6300 also cuts the integrated circuit dies 51, 50, and 53 from a silicon wafer prior to placement on the die pads 22-29. The KNS 6300 is described as an example only. Many other die attachment machines are suitable for the process step 202.

At process step 204, the integrated circuit die attachments formed at process step 202 are cured in a furnace. For one embodiment, the adhesive layers 41, 52, and 43, comprise epoxy paste, and are cured (typically at 180° C. for one hour) at a high temperature in order to provide rigid support to the integrated circuit dies.

An alternative die attach method may be employed to accommodate thin wafers. Very thin integrated circuit dies are required to accommodate two dies in a very thin chip package. In order to prevent handling damage to very thin wafers, a wafer saw operation that isolates individual integrated circuit dies from the wafer is combined with a die attach adhesive media. The wafers are mounted on the tape with a conductive adhesive layer. After a saw operation, the individual integrated circuit dies are picked off the tape with the adhesive layer and mounted on the die pads with KNS 6300. The die attach cure operation is performed using a prescribed temperature profile with typical peak temperatures up to 200° C. Such a process does not require separate adhesive dispense operation.

The alternative die attach method may also be employed when adhesive dispensing causes overflow onto the die surface due to the thin integrated circuit dies. A separate adhesive dispense operation often requires better control to avoid overflow of the paste.

Figure 6:
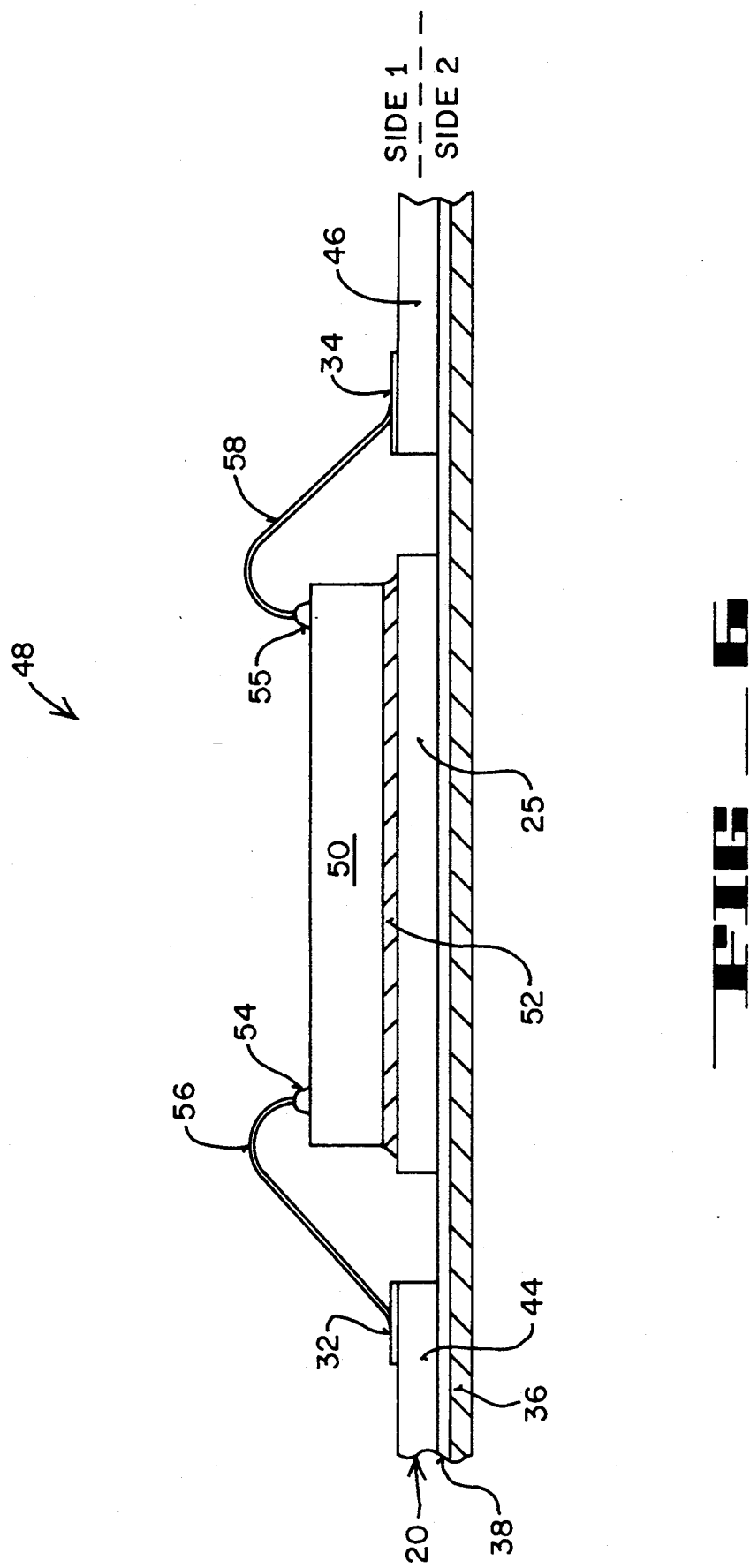
FIG. 6 illustrates the wire bonding of the integrated circuit die to the lead fingers of the leadframe on side 1.

At process step 206, the integrated circuit dies attached to side 1 are wire bonded to the appropriate lead fingers of the leadframe 20. FIG. 6 illustrates the wire bonding of the integrated circuit die 50 to the lead fingers 44 and 46 of the leadframe 20. A wire bond 56 is shown coupled between a signal pad 54 of the integrated circuit die 50 and the lead finger 44. The wire bond 56 couples to the lead finger 44 through the spot silver plated area 32 on the lead finger 44. Similarly, a wire bond 58 is coupled between a signal pad 55 and the lead finger 46 through the spot silver plated area 34.

The die pad 25, the integrated circuit die 50 and the wire bonds 56 and 58 to the lead fingers 44 and 46 comprise an integrated circuit die assembly 48. The process step 206 creates an integrated circuit die assembly similar to the integrated circuit die assembly 48 for each die pad 22-29 on side 1 of the leadframe 20.

For one embodiment, the process step 206 is performed with KNS 1484 wire bonder. The wire bonder provides a heating block (now shown) that engages the tape 36 on side 2 of the leadframe 20 beneath the die pad 25. The heating block heats the die pad 25 and the integrated circuit die 50 to an appropriate temperature. The a KNS 1484 wire bonder sews a wire bond between each signal pad of the integrated circuit die 50 and a corresponding lead finger of the leadframe 20. The KNS 1484 wire bonder is described as an example. Many other wire bonder machines are suitable for the process step 206.

Wire bonding is conventionally performed between temperatures of 240° C.-200° C. However, it is preferable that the process step 206 be performed between 170° C.-200° C. for manufacturing synergy because the wire bonding process step for side 2 is performed between 170° C. -200° C.

Figure 7:
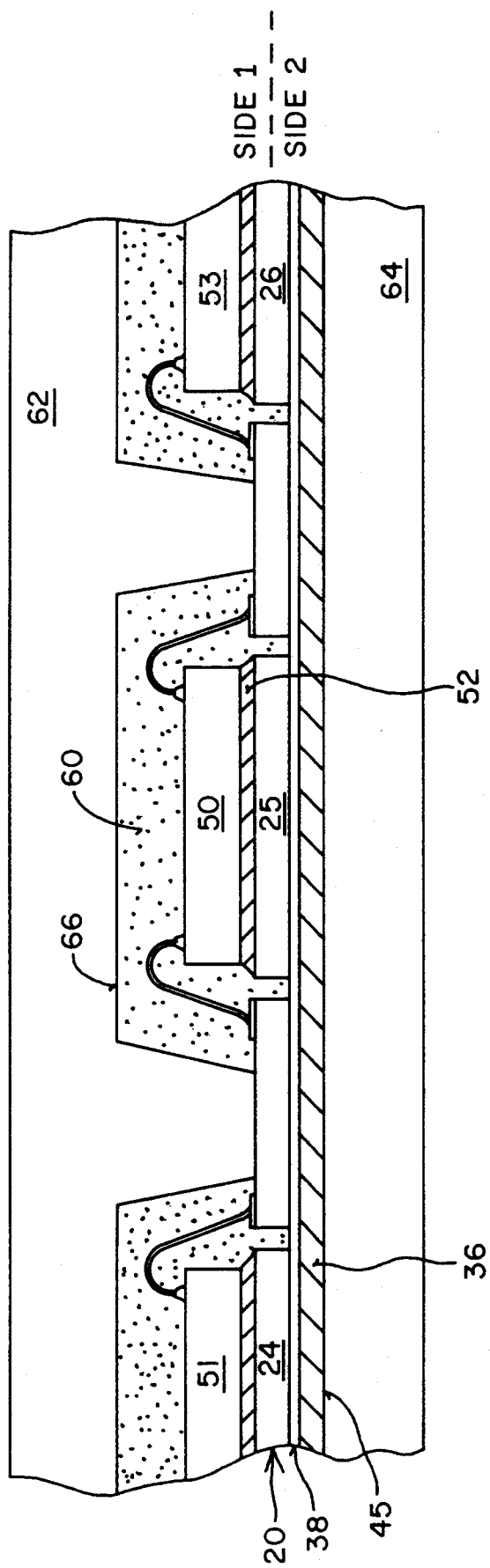
FIG. 7 is a cross sectional view of the integrated circuit die assemblies on side 1 of the leadframe positioned in an injection mold press.

At process step 208, plastic mold is applied to side 1 through an injection mold press. FIG. 7 is a cross sectional view of the integrated circuit die assemblies on the leadframe 20 positioned in an injection mold press during process step 208. The injection mold press comprises a top mold 62 and a bottom mold 64. The bottom mold 64 engages a bottom surface 45 of the tape 36.

The top mold 62 provides a mold cavity for each of the integrated circuit die assemblies on side 1 of the leadframe 20. For example, the top mold 62 provides a cavity 66 for the integrated circuit die assembly 48. A plastic mold injector (not shown) injects plastic into each mold cavity of the top mold 62. For example, the plastic mold injector injects plastic into the mold cavity 66 to form a plastic mold 60 around the integrated circuit die assembly 48.

At process step 210, the plastic molds on side 1 of the leadframe 20 are cured. The plastic molds, such as the plastic mold 60, are formed of an epoxy molding compound that conventionally requires several hours cure at temperatures ranging from 165°-180° C. For one embodiment, however, the curing interval at process step 210 is preferably limited typically to one hour or less. The limited curing at process step 210 prevents overcuring of the plastic molds on side 1 of the leadframe 20 during the mold curing step for side 2.

The process step 210 results in the formation of a set of plastic chip packages on side 1 of the leadframe 20. For example, one plastic chip package comprises the die pad 25, the integrated circuit die 50, and the wire bonds 56 and 58 enclosed in the plastic mold 60.

Figure 8:
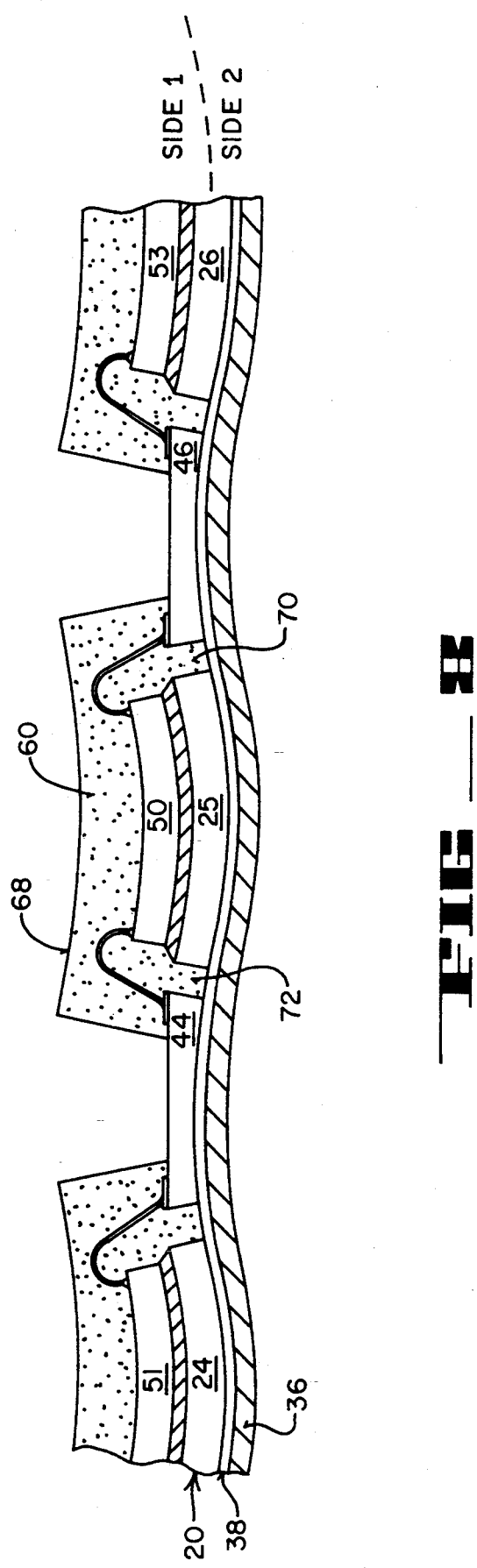
FIG. 8 illustrates possibilities of worst case warping of the leadframe at the completion of the side 1 process steps after cooling to room temperature.

FIG. 8 illustrates possibilities of worst case warping of the leadframe 20 at the completion of the side 1 process steps 200-210 if allowed to cool to room temperature. The warping shown occurs as the plastic mold of each plastic chip package on side 1 of the leadframe 20 sets in. The set in plastic molds on side 1 warp the leadframe 20 and the corresponding integrated circuit dies. The warping occurs because the top surfaces of the plastic molds on side 1 shrink while the bottom surfaces of the plastic molds are held by the leadframe 20.

For example, as the plastic mold 60 sets after the process steps 200-210, a top surface 68 shrinks. At the same time, plastic mold areas 70 and 72 are held in place by the leadframe 20. The plastic mold area 70 is held between the die pad 25 and the lead finger 44, while the plastic mold area 72 is held between the die pad 25 and the lead finger 46. The differing levels of shrinkage between the top surface 68 and the plastic mold areas 70 and 72 cause the plastic mold 60 and the integrated circuit die 50 and the die pad 25 to warp.

Such an excessive warping of the plastic mold 60 can cause the integrated circuit die 50 or the plastic mold 60 to crack. The plastic chip packages on side 1 can tolerate excessive warping only for a short time interval at the completion of process steps 200-210.

The selection of compatible materials reduces the differential shrinkage between the top surfaces of the plastic molds and the bottom surfaces. For example, steel or copper alloys along with molding compounds having similar shrinkage or expand properties reduces the warping. The selection of compatible materials may obviate the use high temperature to compensate for warping.

Figure 9:
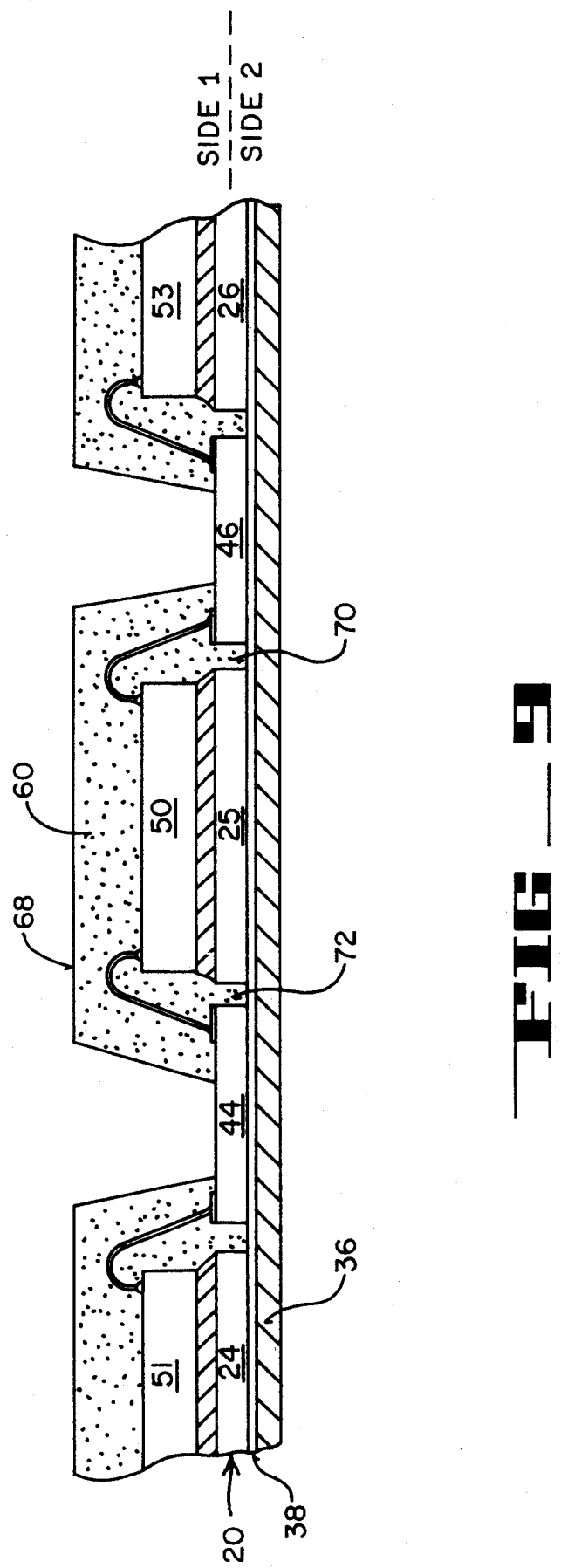
FIG. 9 illustrates the straight leadframe after the side 1 process steps wherein the assembly is maintained at a high temperature, or wherein warping is controlled by compatible material selection.

FIG. 9 illustrates the leadframe 20 after the process step 210 when the assembly is either maintained at a high temperature (typically between 100° and 180° C.) if necessary or warping is controlled by compatible material selection.

The process steps for side 2 are preferably performed at a high temperature. Such high temperatures expand the plastic molds on side 1 of the leadframe 20 and reduce warping. The high temperatures yield the required flat surface for wire bonding integrated circuit dies to side 2 of the leadframe 20.

Figure 10:
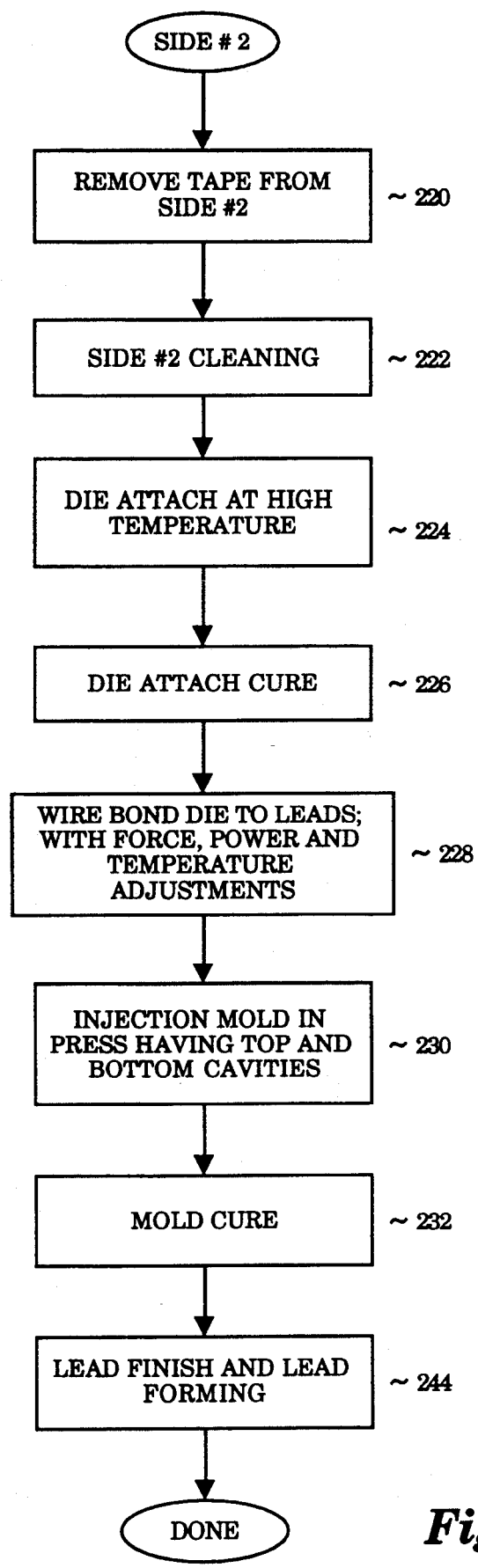
FIG. 10 lists a series of process steps applied to side 2 of the leadframe.

FIG. 10 lists a series of process steps 220–234 applied to side 2 of the leadframe 20 after completion of the process steps 200–210. The process steps 220–234 are applied to form a plastic chip package to side 2 of each of the die pads 22–29. The process steps 220–234 are preferably performed at a high temperature, if necessary.

At process step 220, the tape 36 is removed from side 2. A small amount of heat may be applied to the leadframe 20 during removal of the tape 36.

FIG. 11 illustrates the tape removal and cleaning steps 220 and 222 on side 2 of the leadframe 20. The removal of the tape 36 from side 2 of the leadframe 20 is shown, and reveals mold flash areas 80–83 formed on side 2. The mold flash areas 80–83 are formed by an interaction between the adhesive 38 and the plastic molding compound during formation the plastic molds.

The mold flash areas 80–83 cover silver plating areas 74–76 of the leadframe 20. The mold flash areas 80–83 hinder wire bonding to the silver plating areas 74–76. For example, the mold flash area 80 obscures the silver plating area 74 of the lead finger 44 and hinders wire bonding to the lead finger 44. Similarly, the mold flash area 81 obscures the silver plating area 75 and hinders wire bonding to the lead finger 44, and the mold flash area 82 obscures the silver plating area 76 and hinders wire bonding to the lead finger 46.

The mold flash areas 80–83 can be reduced by adjusting the thickness of the adhesive layer 38. An increase in the thickness of the adhesive layer 38 causes the adhesive layer 38 to partially fill cavities in the leadframe 20 and prevent formation of the mold flash areas 80–83. The formation of mold flash areas 80–83 can also be reduced by adjusting the injection mold parameters such as clamping pressure during the process step 208 on side 1.

At process step 222, side 2 of the leadframe 20 is cleaned to remove the mold flash areas 80–83. A chemical cleaning removes the adhesive layer 38 from side 2 of the leadframe 20. An electrolytic cleaning removes the mold flash areas 80–83 from side 2 of the leadframe 20.

The electrolytic cleaning at the process step 222 creates a rough surface on side 2 of the plastic molding at the mold flash removal areas 80–83. The rough surface on side 2 of the plastic molding improves the plastic molding bond during the side 2 plastic molding step 230.

At process step 224, an integrated circuit die is attached to each die pad 22–29 on side 1 of the leadframe 20. FIG. 12 provides a cross sectional view of the leadframe 20 and attached integrated circuit dies at process step 224. Also shown are the silver plating areas 74–76 exposed by the cleaning process step 222. An integrated circuit die 90 is shown attached to side 2 of the die pad 25 through an adhesive layer 92.

The high temperature for the die attachment of side 2 may be necessary to provide a flat side 2 surface for the leadframe 20.

For one embodiment, the process step 224 is performed with the KNS 6300 die attach machine. The KNS 6300 die attachment machine is modified with a small heating block (not shown) in order to heat each subassembly to provide high temperature, if necessary, heat each sub assembly. For example, the heating block engages the surface 68 of the plastic mold 60 during attachment of the integrated circuit die 90.

At process step 226, the integrated circuit die attachments formed at process step 224 are cured in a furnace. For one embodiment, the adhesive layers on side 2, such as the adhesive layer 92, comprise an epoxy paste, and are cured at a high temperature (typically 180° C. for one hour).

The alternative die attach method previously described may be employed to accommodate thin wafers and/or adhesive overflow onto the die surface due to the thin integrated circuit dies.

At process step 228, the side 2 integrated circuit dies attached to side 2 are wire bonded to the appropriate lead fingers of the leadframe 20. FIG. 13 illustrates the wire bonding of the integrated circuit die 90 to the lead fingers 44 and 46. A wire bond 94 is shown coupled between a signal pad 93 of the integrated circuit die 50 and the lead finger 44. The wire bond 94 couples to the lead finger 44 through the spot silver plated area 75 on the lead finger 44. Similarly, a wire bond 96 is coupled between a signal pad 95 and the lead finger 46 through the spot silver plated area 76.

The process step 228 is performed with a heating block (not shown) engaging the surface 68 of the plastic mold 60. The heating block heats the sub assembly to a temperature between 170° and 200° C. For one embodiment, the process step 228 is performed with a KNS 1484 wire bonder.

During the process step 228 on the integrated circuit die 90, the plastic mold 60 absorbs the mechanical force and the ultrasonic energy generated by the wire bond machine. As a consequence, the mechanical force and the ultrasonic energy generated by the wire bond machine is increased over the force and energy employed during side 1 wire bonding at step 206. In addition, the temperature during the side 2 wire bond of the process step 228 is relatively low in comparison to conventional wire bonding. The relatively low wire bonding temperature prevents cracking of the plastic mold 60.

The die pad 25, the integrated circuit die 90 and the wire bonds 94 and 96 to the lead fingers 44 and 46 comprise an integrated circuit die assembly 49. The process step 228 creates an integrated circuit die assembly similar to the integrated circuit die assembly 49 for each die pad 22–29 on side 2 of the leadframe 20.

At process step 230, plastic mold is applied to side 2 through an injection mold press. FIG. 14a is a cross sectional view of the integrated circuit die assemblies on the leadframe 20 positioned in an injection mold press during process step 230 for one embodiment. The injection mold press comprises a top mold 100 and a bottom mold 102. The bottom mold 102 provides a cavity for each plastic mold on side 1 of the leadframe 20. The cavities provide clearance for the side 1 plastic molds. For example, a cavity 104 in the bottom mold 102 provides clearance for the plastic mold 60.

The top mold 100 provides a mold cavity for each of the integrated circuit die assemblies on side 2 of the leadframe 20. For example, the top mold 100 provides a cavity 106 for the integrated circuit die assembly 49. A plastic mold injector (not shown) injects plastic into each mold cavity of the top mold 100. For example, the plastic mold injector injects plastic into the mold cavity 106 to form a plastic mold 110 around the integrated circuit die assembly 49.

A primer can be to the side 1 plastic molds prior to the process step 230 to improve adhesion between the side 1 and side 2 plastic molds.

At process step 232, the plastic molds on side 2 of the leadframe 20 are cured. The plastic molds, such as the plastic mold 110, are formed of an epoxy molding compound that are preferably cured between 165°–180° C. for several hours. The limited curing at process step 232 prevents overcuring of the plastic molds on side 1 of the leadframe 20.

The process step 232 results in the formation of a set of plastic chip packages on side 2 of the leadframe 20. For example, one plastic chip package comprises the die pad 25, the integrated circuit die 90, and the wire bonds 94 and 96 enclosed in the plastic mold 110.

At process step 234, the lead fingers of the leadframe 20 are electroplated with a lead-tin compound. The lead fingers are then formed into a final shape.

FIG. 14b is a cross sectional view of the integrated circuit die assemblies on the leadframe 20 positioned in an injection mold press during process step 230 for another embodiment. The injection mold press comprises a top mold 120 and a bottom mold 122. The bottom mold 122 provides an expanded cavity for each plastic mold on side 1 of the leadframe 20. The cavities provide clearance for the side 1 plastic molds and for accepting side 2 injected plastic. For example, a cavity 124 in the bottom mold 122 provides clearance for the plastic mold 60.

The top mold 120 provides a mold cavity for each of the integrated circuit die assemblies on side 2 of the leadframe 20. For example, the top mold 120 provides a cavity 126 for the integrated circuit die assembly 49. A plastic mold injector (not shown) injects plastic into each mold cavity of the top mold 120. For example, the plastic mold injector injects plastic into the mold cavity 126 to form a plastic mold around the integrated circuit die assembly 49 and the plastic mold 60.

During the process step 230, a single coherent plastic encapsulation is formed around each dual-sided chip package. An external "seam" does not appear between side 1 and side 2. Such a package may have better cosmetic appeal and the possibility of increased reliability.

FIG. 15 is a cross sectional view of a dual-side plastic chip package 130. The dual-side plastic chip package 130 comprises the integrated circuit dies 50 and 90 mounted on opposite sides of the die pad 25 and enclosed by the plastic molds 60 and 110. The integrated circuit die 50 is wire bonded to the lead fingers 40 (lead finger 44 is shown) and the lead fingers 42 (lead finger 46 is shown). The integrated circuit die 90 is wire bonded to the lead fingers 40 and the lead fingers 42.

The leadframe 20 provides chip select lead fingers that are wire bonded to the integrated circuit die 50 and the integrated circuit die 90. The chip select lead fingers provide electrical coupling to chip select circuitry on the integrated circuit dies 50 and 90. The chip select lead fingers enable selection of either the integrated circuit die 50 or the integrated circuit die 90 or both by external circuitry coupled to the dual-side plastic chip package 130.

For one embodiment, the integrated circuit die 90 is fabricated as a mirror image of the integrated circuit die 50. The integrated circuit die 90 is taped out as a mirror wafer in comparison to the integrated circuit die 50. Such mirror imaging of integrated circuit dies on sides 1 and 2 of the leadframe 20 enables sharing of common lead fingers during interconnect of the integrated circuit dies 50 and 90. For example, the lead fingers of the integrated circuit dies 50 and 90 are shared during the wire bonding steps discussed above.

For one embodiment, the dual-side plastic chip package 130 comprises a memory device package. The lead finger interconnections share address input pins, data input/output pins, output enable and write enable pins, erase/program power supply pins, and device power supply pins and ground pins for both the integrated circuit dies 50 and 90.

The chip select lead fingers for the memory device package are implemented in a staggered arrangement on the leadframe 20. The staggered arrangement of chip select lead fingers enables the interconnection of a separate chip select lead finger to each of the integrated circuit dies 50 and 90. The separate chip select lead fingers enables circuitry external to the memory device package to access the integrated circuit dies 50 and 90 independently or simultaneously.

The chip select (also known as chip enable) inputs activate the memory device logic, input buffers, decoders, and sense amplifiers of the corresponding integrated circuit dies 50 and 90. When the chip select input deselects, the power consumption of the corresponding integrated circuit die 50 and 90 reduces to standby levels.

In the foregoing specification the invention has been described with reference to specific exemplary embodiments thereof. It will, however, be evident that various modifications and changes may be made thereto without departing from the broader spirit and scope of the invention as set forth in the appended claims. The specification and drawings are accordingly to be regarded as illustrative rather than a restrictive sense.

What is claimed is:

1. A method for constructing a dual sided integrated circuit chip package, comprising the steps of:

forming a leadframe comprising a set of die pads, and a set of lead fingers corresponding to each die pad, the lead frame having a first side and a second side;

disposing a metal plating on the first side and the second side of a tip of each lead finger;

disposing a tape to the second side of the leadframe with a tape adhesive layer;

disposing a side one integrated circuit die on the first side of each die pad, such that the side one integrated circuit dies are held to the die pads with a first adhesive layer;

wire bonding each side one integrated circuit die to the first side of the corresponding lead fingers;

forming a side one plastic mold over each side one integrated circuit die;

removing the tape from the second side of the lead frame;

cleaning the tape adhesive layer from the second side of the leadframe to remove a mold flash of the side one plastic molds from the metal plating on the second side of the tip of each lead finger;

disposing a side two integrated circuit die on the second side of each die pad, such that the side two integrated circuit dies are held to the die pads with a second adhesive layer;

wire bonding each side two integrated circuit die to the second side of the corresponding lead fingers using a mechanical force and an ultrasonic energy to overcome an energy absorption of the side one plastic molds;

forming a side two plastic mold over each side two integrated circuit die.

2. The method of claim 1, wherein the step of removing the tape from the second side of the lead frame comprises the step of removing the tape from the second side of the lead frame by applying heat to the leadframe.

3. The method of claim 1, wherein the step of disposing a side two integrated circuit die on the second side of each die pad comprises the step of disposing a side two integrated circuit die on the second side of each die pad while maintaining a high temperature, such that the side two integrated circuit dies are held to the die pads with a second adhesive layer.

4. The method of claim 1, wherein the step of cleaning the tape adhesive layer from the second side of the leadframe comprises the step of chemically cleaning the tape adhesive layer from the second side of the leadframe to remove the mold flash of the side one plastic molds from the metal plating on the second side of the tip of each lead finger.

5. The method of claim 1, wherein the step of cleaning the tape adhesive layer from the second side of the leadframe comprises the step of performing an electrolytic cleaning of the second side of the lead frame to remove the mold flash of the side one plastic molds from the metal plating on the second side of the tip of each lead finger.

6. The method of claim 1, wherein the step of forming a side one plastic mold over each side one integrated circuit die comprises the step of forming the side one plastic mold over each side one integrated circuit die using an injection mold press.

7. The method of claim 1, wherein the step of forming a side two plastic mold over each side two integrated circuit die comprises the step of forming the side two plastic mold over each side two integrated circuit die using an injection mold press having a bottom mold with a cavity corresponding to each side one plastic mold, the cavities in the bottom mold accepting the side one plastic molds.

8. The method of claim 1, wherein the step of forming a side two plastic mold over each side two integrated circuit die comprises the step of forming the side two plastic mold over each side two integrated circuit die using an injection mold press having a bottom mold with an expanded cavity corresponding to each side one plastic mold, the cavities in the bottom mold accepting the side one plastic molds and providing clearance for encapsulating the side one plastic molds within the side two plastic molds.

9. The method of claim 1, wherein the steps after the step of forming a side one plastic mold over each side one integrated circuit die are performed at the high temperature.

10. The method of claim 9, wherein the high temperature is a temperature between 100° and 200° C.

11. The method of claim 1, wherein a molding compound is used to form the side one plastic molds, and wherein the leadframe is formed from a material having shrinkage and expansion properties similar to the molding compound, such that warping of the leadframe from the side one plastic molds is minimized.

12. The method of claim 1 wherein the step of wire bonding each side two integrated circuit die to the second side of the corresponding lead fingers is performed at a temperature below 200° C. to prevent the side one plastic molds from cracking.

13. The method of claim 1, wherein a thickness of the tape adhesive layer is selected to minimize a formation of the mold flash during the step of forming a side one plastic mold over each side one integrated circuit die.

14. The method of claim 1, wherein the tips of the lead fingers are formed with an expanded surface area and a staggered arrangement to improve adhesion between the tape and the second side of the leadframe.

15. The method of claim 1, wherein the step of cleaning the tape adhesive layer from the second side of the leadframe further comprises the step of applying a primer to the side one plastic molds adjacent to the second side of the leadframe, such that the primer improves adhesion between the side one and the side two plastic molds.

16. The method of claim 1, wherein the side two integrated circuit die implements a mirror image of the circuitry implemented on the side one integrated circuit die.

17. The method of claim 16, wherein the lead fingers corresponding to each die pad comprise a set of shared lead fingers and a side one chip select lead finger and a side two chip select lead finger.

18. The method of claim 17, wherein the step of wire bonding each side one integrated circuit die to the first side of the corresponding lead fingers comprises the steps of wire bonding each side one integrated circuit die to the first side of the corresponding shared lead fingers, and wire bonding each side one integrated circuit die to the first side of the corresponding side one chip select lead finger.

19. The method of claim 18, wherein the step of wire bonding each side two integrated circuit die to the second side of the corresponding lead fingers comprises the steps of wire bonding each side two integrated circuit die to the second side of the corresponding shared lead fingers, and wire bonding each side two integrated circuit die to the second side of the corresponding side two chip select lead finger.

* * * * *